(12) United States Patent
Kameshima et al.

(10) Patent No.: US 7,595,831 B2
(45) Date of Patent: Sep. 29, 2009

(54) IMAGING APPARATUS, RADIATION IMAGING APPARATUS, AND RADIATION IMAGING SYSTEM

(75) Inventors: Toshio Kameshima, Kumagaya (JP); Tadao Endo, Honjo (JP); Tomoyuki Yagi, Honjo (JP); Katsuro Takenaka, Kodama-gun (JP); Keigo Yokoyama, Honjo (JP)

(73) Assignee: Canon Kabushiki Kaisha, Tokyo (JP)

( * ) Notice: Subject to any disclaimer, the term of this patent is extended or adjusted under 35 U.S.C. 154(b) by 365 days.

(21) Appl. No.: 11/737,592

(22) Filed: Apr. 19, 2007

(65) Prior Publication Data
US 2007/0258008 A1    Nov. 8, 2007

(30) Foreign Application Priority Data
Apr. 21, 2006  (JP) .............................. 2006-118325
Mar. 30, 2007  (JP) .............................. 2007-092029

(51) Int. Cl.
*H04N 3/14* (2006.01)

(52) U.S. Cl. ..................................................... 348/308
(58) Field of Classification Search .................. 348/308
See application file for complete search history.

(56) References Cited

U.S. PATENT DOCUMENTS

| | | | | |
|---|---|---|---|---|
| 5,184,018 | A * | 2/1993 | Conrads et al. | 250/370.09 |
| 7,381,963 | B2 * | 6/2008 | Endo et al. | 250/370.09 |
| 2001/0012070 | A1 * | 8/2001 | Enod et al. | 348/302 |
| 2001/0012170 | A1 | 8/2001 | Enod et al. | |
| 2005/0051704 | A1 | 3/2005 | Kashiura et al. | |
| 2005/0200720 | A1 * | 9/2005 | Kameshima et al. | 348/220.1 |
| 2006/0284806 | A1 * | 12/2006 | Maki | 345/89 |

FOREIGN PATENT DOCUMENTS

| | | |
|---|---|---|
| CN | 1591911 A | 3/2005 |
| EP | 0796000 A2 | 9/1997 |
| JP | 2004031658 A | 1/2004 |

* cited by examiner

*Primary Examiner*—James M Hannett
(74) *Attorney, Agent, or Firm*—Canon U.S.A., Inc. IP Division

(57) ABSTRACT

An imaging apparatus includes a sensor array in which a plurality of pixels each including a photoelectric conversion element and a switching element are arrayed in a row direction and a column direction, signal wiring connected to a plurality of the switching elements provided in the column direction, and a reading-circuit unit connected to the signal wiring, where the reading-circuit unit includes a first operational area including a first amplifying circuit and a second operational area including a second amplifying circuit connected to the first operational area, and the first and second amplifying circuits are each arranged to be supplied with power within a range, the maximum of the power-supply voltage range of the first amplifying circuit being larger than the maximum of a power-supply voltage range of the second amplifying circuit.

13 Claims, 16 Drawing Sheets

IMAGING APPARATUS, RADIATION IMAGING APPARATUS, AND RADIATION IMAGING SYSTEM

BACKGROUND OF THE INVENTION

1. Field of the Invention

The present invention relates to an imaging apparatus, a radiation imaging apparatus, and a radiation imaging system. For the purpose of this description, the term "radiation" also encompasses electromagnetic waves such as X-rays and γ-rays, α-rays, and β-rays.

2. Description of the Related Art

Recently, known flat-panel photoelectric conversion apparatuses and radiation imaging apparatuses include an area sensor array in which an amorphous silicon or polysilicon film formed on an insulating substrate, such as a glass substrate, is used as a material and pixels composed of photoelectric conversion elements and thin-film transistors (TFTs) are two-dimensionally arrayed. In these apparatuses, by driving the TFTs in a matrix manner, charges that have been subjected to photoelectric conversion in the photoelectric conversion elements are transferred to a reading-circuit unit and read out.

An apparatus according to the related art will now be described. A known flat-panel area sensor includes a sensor array in which pixels composed of amorphous silicon PIN photodiodes and TFTs, which are formed on a glass substrate, are two-dimensionally arrayed. The area sensor is driven in a matrix manner. A bias voltage is applied from a power supply to the common electrode side of the PIN photodiode of each pixel. A gate electrode of the TFT of each pixel is connected to a common gate line, and the common gate line is connected to a gate-driving circuit unit composed of a shift register.

On the other hand, a source electrode of each TFT is connected to a common signal line, which is connected to a reading-circuit unit including an operational amplifier, a sample and hold circuit, an analogue multiplexer, a buffer amplifier, and so forth.

Analog signals output from the reading-circuit unit are digitized by an A/D converter and processed by an image-processing unit composed of a memory, a processor, and the like. The processed signals are then output to a display apparatus such as a monitor or stored in a recording apparatus such as a hard disk.

European Patent Publication No. 0796000, U.S. Pat. No. 5,184,018, and Japanese Patent Laid-Open No. 2004-031658 describe in detail a flat-panel photoelectric conversion apparatus and radiographic apparatus that acquire image signals by driving an area sensor array in a matrix manner using a reading-circuit unit and a gate-driving circuit unit as described above.

All the patent documents describe not only a basic operation of the area sensor but also a configuration in which the reading-circuit unit includes a first-stage amplifier connected to each common signal line, and/or a multiplexer. In some of the documents, the reading-circuit unit further includes multistage amplifiers. Furthermore, the documents also disclose an example of an amplifier made of a crystal semiconductor.

SUMMARY OF THE INVENTION

Radiation imaging apparatuses used for a medical X-ray imaging system generally require excellent performance in terms of power consumption characteristics, noise characteristics, and dynamic range characteristics, compared with consumer imaging apparatuses.

In particular, in order to realize a medical X-ray imaging system that can perform both fluoroscopic imaging (moving imaging) and still imaging, the X-ray imaging system must have a low noise level and a sufficient dynamic range in spite of low power consumption. However, in examples of the known art, all these characteristics are not necessarily satisfied.

In order to realize both a reduction in power consumption and a reduction in noise level, for example, Japanese Patent Laid-Open No. 2004-031658 describes a configuration in which the supply current in each circuit area of a multistage amplifying circuit of a reading-circuit unit can be changed and controlled as follows.

Namely, in order to reduce the noise level, in the fluoroscopic imaging (moving imaging), the current supplied to the multistage amplifying circuit is controlled to be increased, whereas in the still imaging, the current supplied to the multistage amplifying circuit is controlled to be decreased. According to the configuration described in Japanese Patent Laid-Open No. 2004-031658, overall power consumption can be decreased compared with a configuration in which a constant current is supplied both in the fluoroscopic imaging and in the still imaging.

However, in general, considering the time required for imaging, i.e., the energizing time to the reading-circuit unit, since the relationship "time required for fluoroscopic imaging>>time required for still imaging" is present, the effect is not sufficient in some cases.

In particular, when the above configuration is applied to a system that mainly performs fluoroscopic imaging, heat generation due to the power consumption is not negligible, resulting in an adverse effect of degradation of image quality due to an increase in temperature or an increase in the size of the apparatus because of an addition of a cooling mechanism.

In the above patent documents other than Japanese Patent Laid-Open No. 2004-031658, the concept of power consumption characteristics itself is not described. In addition, all the above patent documents do not describe the concept of dynamic range characteristics that is required for the reading-circuit unit connected to the area sensor array.

As described above, none of the above documents describe the concept for improving power consumption characteristics, noise characteristics, and dynamic range characteristics, and specific configurations that can realize the improvement are not disclosed.

The present invention has been made in view of the above situation and provides an imaging apparatus, a radiation imaging apparatus, and a radiation imaging system in which power consumption characteristics, noise characteristics, and dynamic range characteristics can be improved.

An imaging apparatus of at least one exemplary embodiment of the present invention includes a sensor array in which a plurality of pixels each including a photoelectric conversion element and a switching element are arrayed in a row direction and a column direction, signal wiring connected to a plurality of the switching elements provided in the column direction, and a reading-circuit unit connected to the signal wiring, where the reading-circuit unit includes a first operational area including a first amplifying circuit and a second operational area including a second amplifying circuit connected to the first operational area, and the first and second amplifying circuits are each arranged to be supplied with power within a range, the maximum of the power-supply voltage range of the first amplifying circuit being larger than the maximum of a power-supply voltage range of the second amplifying circuit.

A radiation imaging apparatus of the present invention includes a sensor array in which a plurality of pixels each including a conversion element that converts radiation to electric signals and a switching element are arrayed in a row direction and a column direction, signal wiring connected to a plurality of the switching elements provided in the column direction, and a reading-circuit unit connected to the signal wiring, where the reading-circuit unit includes a first operational area including a first amplifying circuit and a second operational area including a second amplifying circuit connected to the first operational area, and the first and second amplifying circuits are each arranged to be supplied with power within a range, the maximum of the power-supply voltage range of the first amplifying circuit being larger than the maximum of a power-supply voltage range of the second amplifying circuit.

According to another exemplary embodiment of the present invention, in an imaging apparatus or a radiation imaging apparatus, the power consumption of the reading-circuit unit, and furthermore, the power consumption of the whole imaging apparatus or the whole radiation imaging apparatus can be reduced. Furthermore, a sufficient dynamic range can be realized with a low noise level while heat generation due to the power consumption is reduced.

Further features of the present invention will become apparent from the following description of exemplary embodiments with reference to the attached drawings.

DESCRIPTION OF THE EMBODIMENTS

First Embodiment

Figures 13A, 13B:
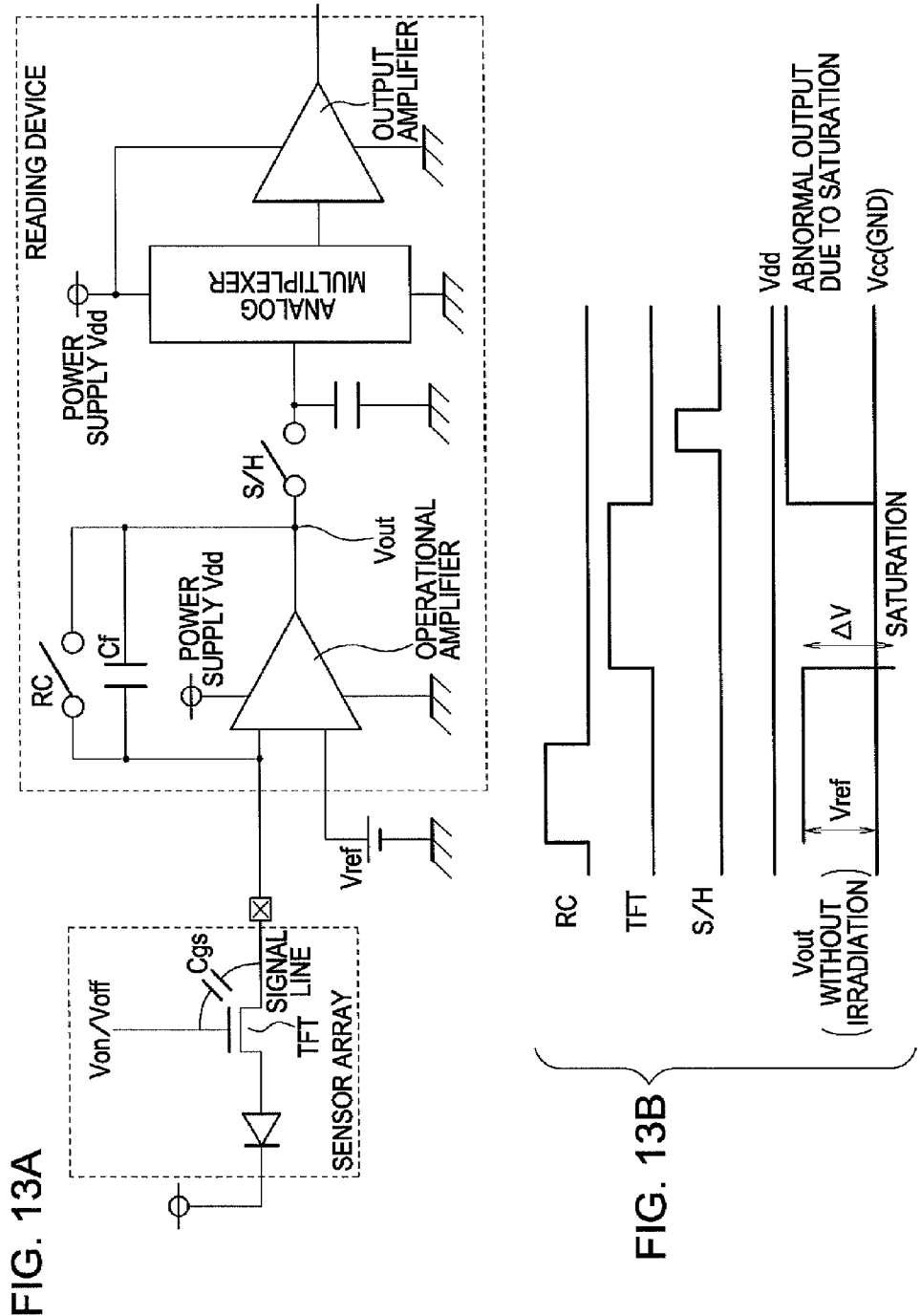
FIGS. 13A and 13B are diagrams illustrating a problem to be considered in a radiation imaging apparatus of the present invention.

Dynamic range characteristics required for a reading-circuit unit, which have been found by the present inventor, will now be described with reference to FIGS. 13A and 13B. FIG. 13A shows an equivalent circuit of a pixel of a sensor array and a reading-circuit unit connected to a signal line. A plurality of pixels are connected to each signal line in the actual circuit but are omitted in the figure for simplicity. The actual reading-circuit unit also includes a plurality of amplifiers, but those are also omitted.

In the figure, Von represents an on-state voltage applied from a gate-driving circuit unit to a gate electrode of a TFT (switching element), and Voff represents an off-state voltage applied from the gate-driving circuit unit to the gate electrode of the TFT. In an operational amplifier connected to the signal line, the reference voltage is represented by Vref and the power supply voltage is represented by Vdd/GND (ground). The operational amplifier includes a capacitor Cf and constitutes a charge-reading circuit. Cgs in the figure represents a gate-source parasitic capacitance of the TFT.

FIG. 13B is a timing diagram showing a signal of each part when the equivalent circuit shown in FIG. 13A operates. First, when an RC signal becomes a high level, a switch RC of the operational amplifier is closed, and the signal line and the amplifier output are reset to Vref. After the switch RC becomes an off state, the TFT turns to an on state, and signal charges stored in a photoelectric conversion element are transferred to the capacitor Cf of the reading-circuit unit and converted to a voltage.

Here, it should be noted that when the TFT turns to the on state, charges Qc that are approximately represented by an equation below are temporarily injected by the parasitic capacitance to the reading-circuit unit.

$$\text{Charges } Qc \text{ injected by parasitic capacitance} = Cgs \times (Von - Voff)$$

According to the above equation, when an output voltage Vout of the first-stage amplifier allows the TFT to turn to the on state, the following equation is temporarily satisfied.

$$\text{Output voltage } Vout \text{ of first-stage amplifier} = Vref - (Qc/Cf)$$

The relationship represented by the equation suggests the following: In a reading-circuit unit connected to an area sensor array, unnecessarily decreasing the power supply voltage for the purpose of a reduction in power consumption may cause saturation of the amplifying circuit on turning the TFT to the on state and degrade dynamic range characteristics. Accordingly, the power supply voltage of the reading-circuit unit must be carefully selected.

Figure 1:
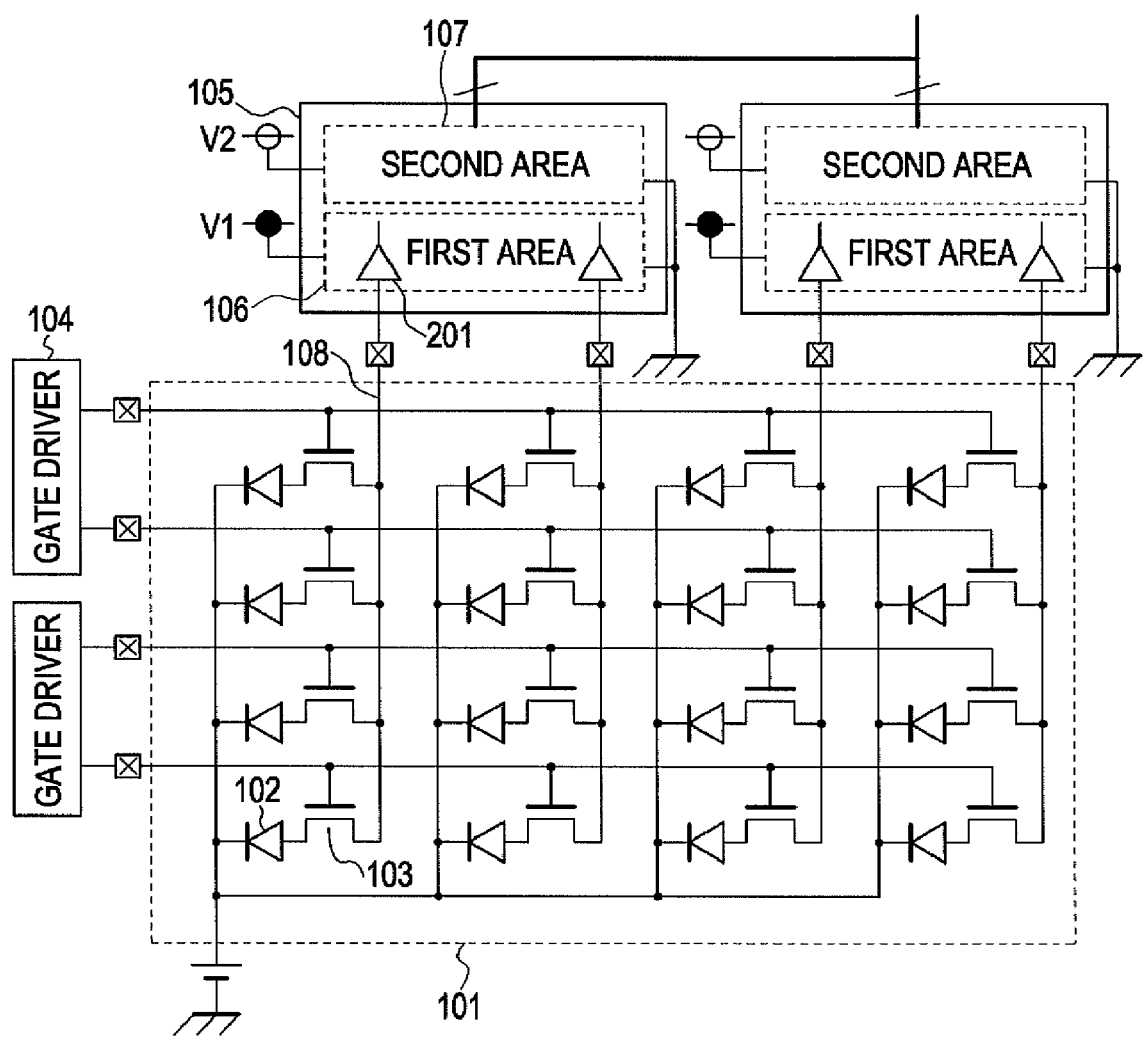
FIG. 1 is a schematic circuit diagram of a radiation imaging apparatus according to a first embodiment of the present invention.

A first embodiment of the present invention will now be described in detail with reference to the drawings. FIG. 1 is a schematic diagram of a radiation imaging apparatus according to the first embodiment of the present invention. A sensor array 101 includes positive-intrinsic-negative (PIN) photodiodes 102 and thin-film transistors (TFTs) 103. Each of the TFTs includes a gate electrode, a source electrode, and a drain electrode. Gate drivers (driving circuit units) 104 supply a gate line (driving wiring) of each TFT 103 with a voltage. Reading-circuit units (reading-circuit units) 105 each include a first area (first operational area) 106 and a second area (second operational area) 107 and are connected to signal lines (signal wiring) 108 connected to the source of the TFTs 103. Each of the first areas 106 includes amplifiers 201 and a power supply voltage V1 (e.g., 5 V) is supplied to the first area 106. A power supply voltage V2 (e.g., 3.3 V) is supplied to the second area 107.

The sensor array 101 includes two-dimensionally arrayed pixels composed of the PIN photodiodes (photoelectric conversion elements) 102 and the TFTs (switching elements) 103, which are made of amorphous silicon, and is driven in a matrix manner. A bias voltage is applied to the common electrode side of the PIN photodiode 102 of each pixel (the cathode side of the diode in the figure). The gate electrode of the TFT 103 of each pixel is connected to the gate line (driving wiring) in common. The gate line is connected to the gate driver 104 composed of a shift register. Each of the signal lines 108 is connected to a plurality of TFTs 103 arrayed in a column direction.

Figure 2:
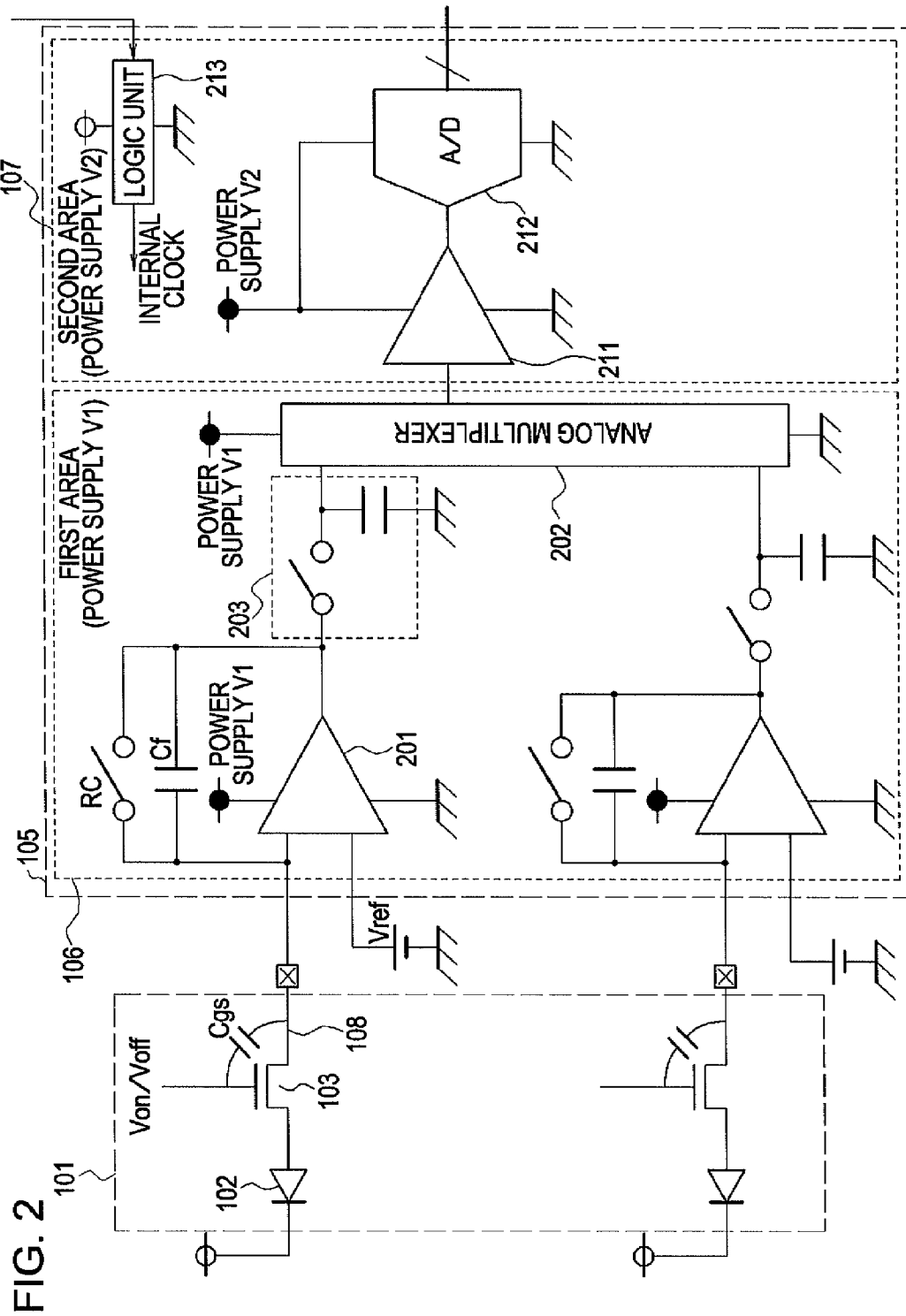
FIG. 2 is a schematic circuit diagram of a reading-circuit unit used in the radiation imaging apparatus according to the first embodiment of the present invention.
Figure 4:
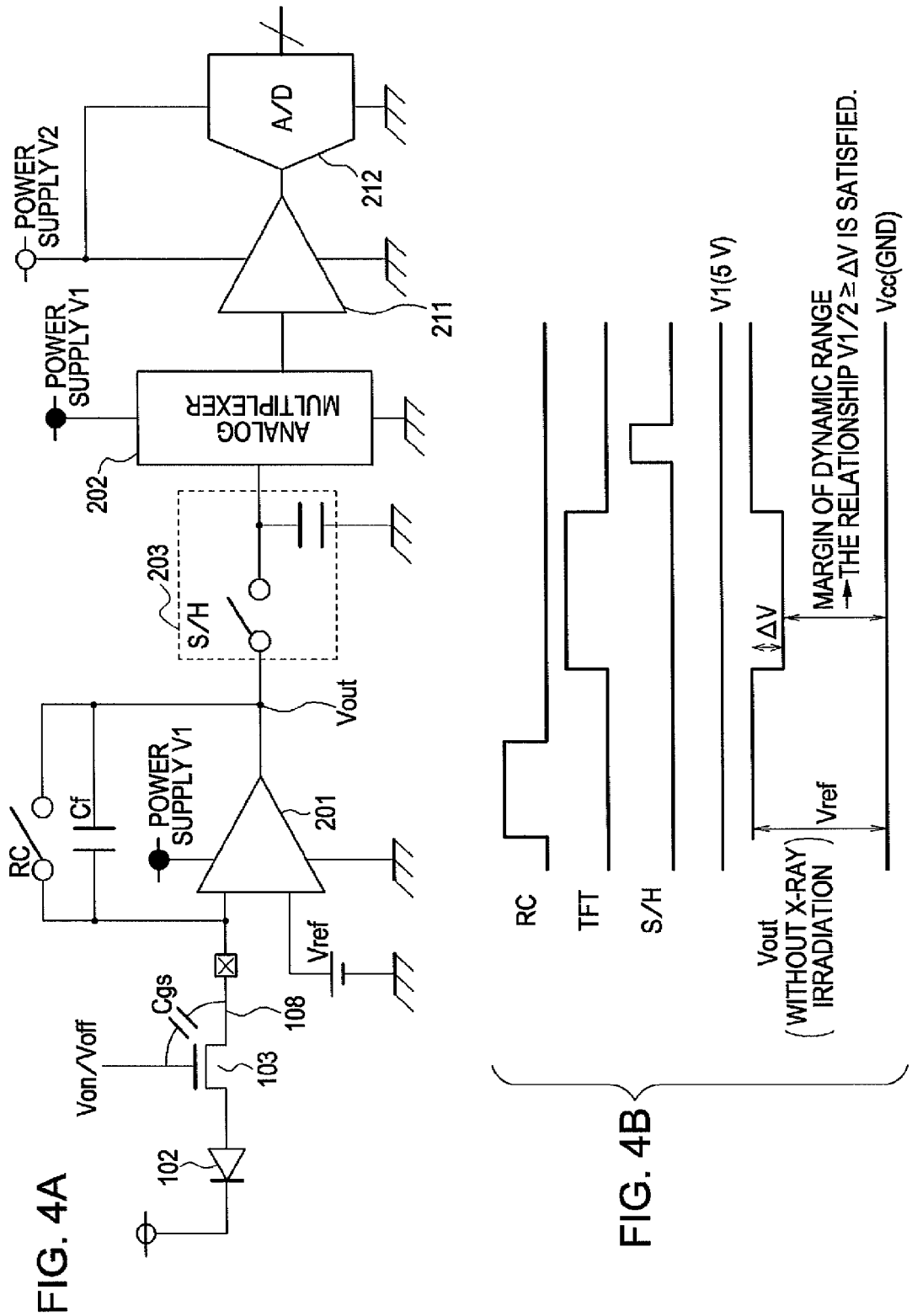
FIGS. 4A and 4B are diagrams illustrating the operation of the radiation imaging apparatus according to the first embodiment of the present invention.

FIG. 2 is a schematic circuit diagram illustrating the specific configuration of the reading-circuit unit 105 shown in FIG. 1. FIGS. 4A and 4B are diagrams illustrating dynamic range characteristics of the first embodiment. The reading-circuit unit 105 is composed of a monolithic integrated circuit. The first area 106 includes an operational amplifier 201, a sample and hold circuit (S/H) 203, an analog multiplexer 202, a charge storage capacitor Cf, and a switch RC. The second area 107 includes a programmable gain amplifier 211, an A/D converter 212, and a logic unit 213. The power supply voltage V1 is supplied to the operational amplifier 201 and the analog multiplexer 202 in the first area 106. The power supply voltage V2 is supplied to the programmable gain amplifier 211, the A/D converter 212, and the logic unit 213 in the second area 107.

The signal line 108 is connected to either the source electrode or the drain electrode of a plurality of TFTs 103 arrayed in the column direction. The first area 106 is connected to the signal line 108. The second area 107 is connected to the subsequent stage of the first area 106. The first area 106 includes the operational amplifier (amplifying circuit) 201 connected to the signal line 108. The second area 107 includes the programmable gain amplifier (amplifying circuit) 211 connected to the subsequent stage of the first area 106.

A voltage Von is an on-state voltage applied from the gate driver 104 to the gate electrode of the TFT 103. A voltage Voff is an off-state voltage applied from the gate driver 104 to the gate electrode of the TFT 103. In the operational amplifier 201 connected to the signal line 108, the reference voltage is represented by Vref and the power supply voltage is represented by V1/GND (ground). The operational amplifier 201 includes an integral capacitor Cf for charge storage and constitutes a charge-reading amplifier. Furthermore, capacitance Cgs in the figure represents a gate-source parasitic capacitance of the TFT 103.

The source electrode of each TFT 103 is connected to the common signal line 108 and connected to the reading-circuit unit 105 composed of the operational amplifier 201, the sample and hold circuit 203, the analog multiplexer 202, the programmable gain amplifier 211, the A/D converter 212, and so forth.

Analog signals are digitized by the A/D converter 212 and processed by an image-processing unit (not shown) composed of a memory and a processor. The processed signals are then output to a display apparatus such as a monitor or stored in a recording apparatus such as a hard disk (not shown).

Light including subject information is incident on the area sensor array 101 from an irradiation unit. The photodiode 102 converts the light to electric signals by photoelectric conversion. Furthermore, the reset switch RC provided in the operational amplifier 201 turns to an on state by a reset signal to reset the integral capacitor Cf of the operational amplifier 201 and each common signal line 108. Subsequently, a transfer pulse is applied to the common gate line of a first line, and the TFT 103 connected to the common gate line of the first line turns to the on state. Accordingly, signal charges generated in the photodiode 102 are transferred to the reading-circuit unit 105 via the common signal line 108. The transferred charges are converted to a voltage in the operational amplifier 201 connected to each signal line 108.

Subsequently, a sample and hold signal is applied to the sample and hold circuit 203, and the voltage output from the operational amplifier 201 is sampled. The sampled voltage is then held in the capacitor of the sample and hold circuit 203. The voltage is serially converted in the analog multiplexer 202 and input to the A/D converter 212 as an analog signal via the programmable gain amplifier 211. The analog signal input to the A/D converter 212 is converted to a digital signal and input to the image-processing unit as a digital signal in accordance with the resolution of the A/D converter 212.

Subsequently, the integral capacitor Cf of the operational amplifier 201 and each common signal line 108 are again reset by the switch RC, and a transfer pulse is then applied to the common gate line of a second line. Accordingly, charges in the photodiode 102 of the second line are read out via the TFT 103. A similar operation is repeated in the gate lines of a third line and subsequent lines, thereby reading out the charges of the whole sensor array, i.e., the image output data.

Figure 3:
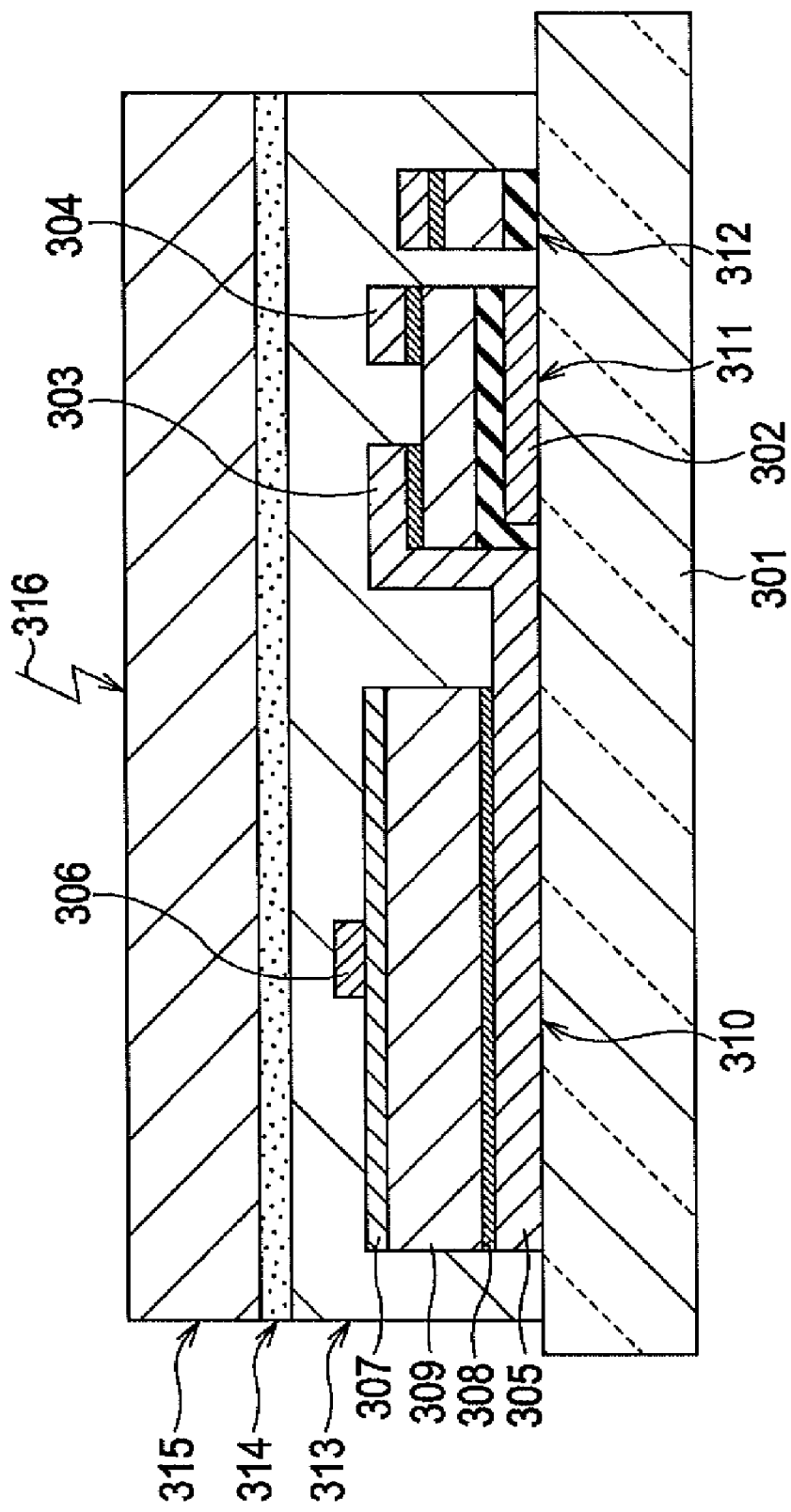
FIG. 3 is a cross-sectional view of a pixel of an area sensor array used in the radiation imaging apparatus according to the first embodiment of the present invention.

FIG. 3 is a cross-sectional view of a pixel of the sensor array 101 of the first embodiment. A photodiode 310, a TFT 311, and a wiring portion 312 are provided on a glass substrate 301. The photodiode 310 includes an upper electrode layer 306, an n-layer 307, a semiconductor layer 309, a p-layer 308, and a lower electrode layer 305. The TFT 311 includes a gate electrode 302, a drain electrode 303, and a source electrode 304. A protective layer 313 covers the photodiode 310, the TFT 311, and the wiring portion 312. An adhesive layer 314 is provided on the protective layer 313. A phosphor layer 315 is provided on the adhesive layer 314. X-rays 316 are incident from the upper part of the phosphor layer 315. The phosphor layer 315 is not necessarily provided on the adhesive layer 314 and may be formed directly on the protective layer 313 by vapor deposition or other processes as known by one of ordinary skill. The phosphor layer 315 can be formed using a gadolinium-based material such as $Gd_2O_2S$:Tb or $Gd_2O_3$:Tb, or an alkali halide such as cesium iodide (CsI) as a main material.

The PIN photodiode 310 of each pixel has a structure in which the lower electrode layer 305, the amorphous silicon p-layer 308, the amorphous silicon semiconductor layer 309, the amorphous silicon n-layer 307, and the upper electrode layer 306 are stacked on the glass substrate 301. The TFT 311 has a structure in which the gate electrode layer (lower electrode) 302, an insulating layer (amorphous silicon nitride film), an amorphous silicon semiconductor layer, an amorphous silicon n-layer, the source electrode layer (upper electrode) 304, and the drain electrode layer (upper electrode) 303 are stacked. The protective layer 313 is provided on the photodiode 310, the TFT 311, and the wiring portion 312, which are deposited on the glass substrate 301, so as to cover the entire surfaces thereof. The protective layer 313 is made of, for example, an amorphous silicon nitride film having a high transmittance for the radiation (X-rays) 316 to be detected. The phosphor layer 315 converts the X-rays 316 to light. The photodiode 310 converts the light to electric signals (charges). The phosphor layer 315 and the photodiode 310 form a conversion element for converting the X-rays (radiation) 316 to electric signals.

Figure 14C:
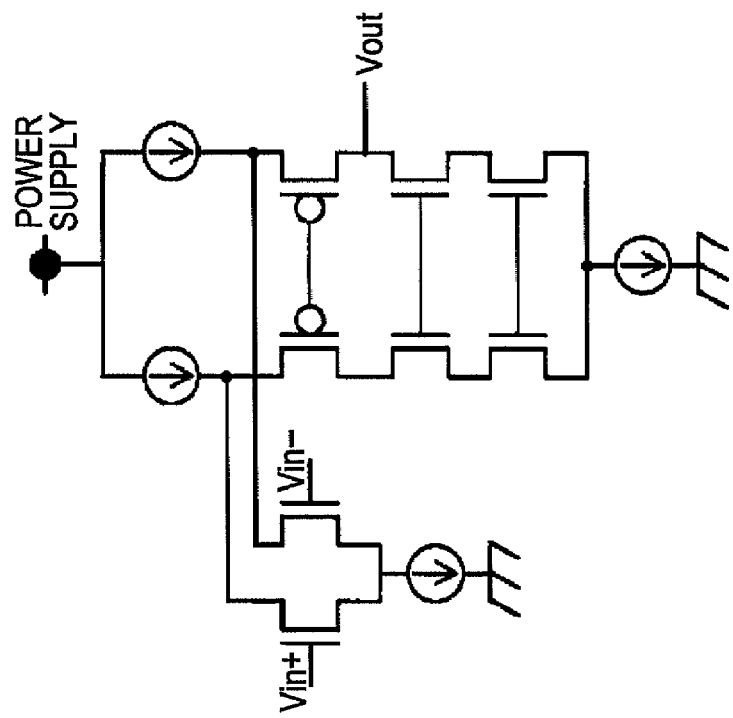
FIGS. 14A to 14C are diagrams each illustrating an amplifying circuit used in the reading-circuit unit of the radiation imaging apparatus according to the first embodiment of the present invention.
Figure 14B:
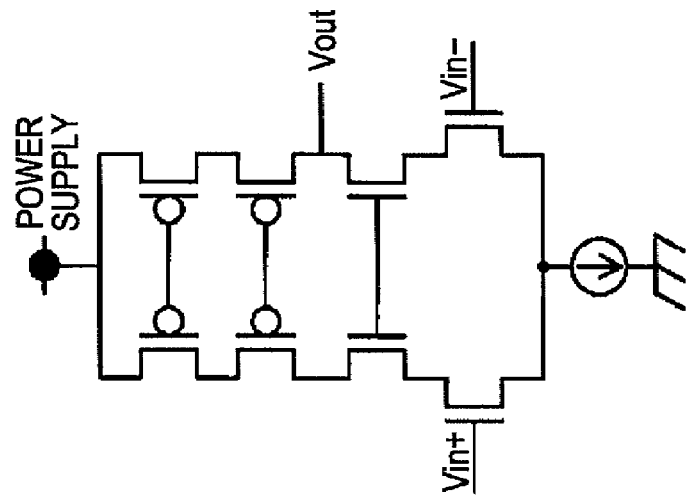
Figure 14A:
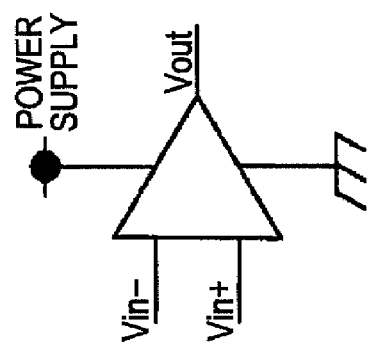

FIG. 14A is a schematic diagram showing an amplifier used in the reading-circuit unit of the radiation imaging apparatus of this embodiment. FIGS. 14B and 14C show specific circuit configurations including the amplifier shown in the schematic diagram of FIG. 14A. FIG. 14B shows an example in which a telescopic amplifier is configured in combination with MOS transistors. FIG. 14C shows an example of a folded cascode amplifier. Either of the amplifiers can be used in either of the areas having the power supply voltages V1 and V2 in the above-described reading-circuit unit. Either the amplifier shown in FIG. 14B or the amplifier shown in FIG. 14C is selected in accordance with the power supply voltage and characteristics required (gain and dynamic range). Different types of amplifiers may be used in the reading-circuit unit. Furthermore, amplifiers other than those shown in FIGS. 14B and 14C may be selected.

The configuration of the radiation imaging apparatus of this embodiment will now be described with reference to FIG. 1. The reading-circuit unit 105 includes at least the first area 106 that operates at a power supply voltage V1 (e.g., +5 V here)/GND and the second area 107 that operates at a power supply voltage V2 (e.g., 3.3 V here)/GND, and the relationship V1>V2 is satisfied. An amplifier 201 is provided in the first area 106 so as to correspond to each signal line 108 of the area sensor array 101.

In the description of the figure, a plurality of reading-circuit units 105 (two reading-circuit units 105 here) are provided, but this is not essential. The number of reading-circuit units 105 may be single or plural. In this description, each of the power supply voltages V1 and V2 is a single power supply of about 5 V or about 3.3 V, but the power supply voltages may be plus and minus voltages. It is sufficient that the power supply range satisfies the relationship V1 (for example, ±5 V)>V2 (for example, ±3.3 V). The maximum of the power-supply voltage range V1 of the first area 106 is larger than the maximum of the power-supply voltage range V2 of the second area 107. That is, the maximum of the power-supply voltage range V1 of the operational amplifier 201 is larger than the maximum of the power-supply voltage range V2 of the programmable gain amplifier 211.

FIG. 2 shows the specific configuration of the reading-circuit unit 105 used in the radiation imaging apparatus of the first embodiment and illustrates the first area 106 and the second area 107 in detail. In this figure, the first-stage amplifier 201 an input terminal of which is connected to the signal line 108 of the sensor array 101, the sample and hold circuit 203, and the analog multiplexer 202 are provided in the first area 106 driven at the power supply voltage V1 (e.g., 5 V here). The programmable gain amplifier 211, which receives an output from the analog multiplexer 202, the A/D converter 212, and the logic unit 213, which processes, for example, high-speed clocks, are provided in the second area 107 driven at the power supply voltage V2 (e.g., 3.3 V here).

In this embodiment, the reading-circuit unit 105 including the first area 106 and the second area 107 is characterized in that the reading-circuit unit 105 is an integrated circuit that is monolithically formed on a crystalline silicon substrate and that the A/D converter 212 is provided in the second area 107 to perform digital output.

As shown in the figure, by providing the first area 106 driven at the power supply voltage V1 and the second area 107 driven at the power supply voltage V2, the power consumption can be markedly decreased compared with a case where the entire part of the reading-circuit unit 105 is driven by the power supply voltage V1.

Furthermore, when the relationship V1>V2 is satisfied, the gain of the first-stage amplifier 201 connected to the signal line 108 can be increased. Accordingly, the reading-circuit unit 105 that is advantageous in terms of noise characteristics can be configured. In addition, the configuration including the A/D converter 212 that is directly connected to the programmable gain amplifier 211 is also advantageous in terms of noise characteristics.

Furthermore, the relationship V1>V2 can prevent the saturation caused by charge injection to the first-stage amplifier when the TFT turns to the on state, thereby achieving satisfactory dynamic range characteristics.

In the figure, the first-stage amplifier 201 connected to the signal line 108, the sample and hold circuit 203, and the analog multiplexer 202 are provided in the first area 106, and the programmable gain amplifier 211 subsequent to the analog multiplexer 202 and the A/D converter 212 are provided in the second area 107. This is an example of the configuration that is advantageous in terms of power consumption, but the boundary between the first area 106 and the second area 107 is not limited to this example. Furthermore, as shown in FIG. 2, the formation of the high-speed logic unit 213 such as clocks in the second area 107 is also advantageous in terms of power consumption.

For simplicity, a description is made with a circuit corresponding to the two signal lines 108 (2channels) in FIG. 2. However, a circuit corresponding to 64 to 256 signal lines (i.e., 64 to 256 channels) can be monolithically formed.

On the other hand, the first area 106 and the second area 107 need not be monolithically formed. The first area 106 and the second area 107 may be formed on separate silicon substrates, and an integrated circuit may then be formed in a hybrid manner. When the integrated circuit is formed in a single package in the hybrid manner, wiring can be shortened compared with a case where these areas are formed on separate chips. This configuration is advantageous in terms of external noise and reliability.

The photoelectric conversion element 102 of the sensor array 101 is not limited to the amorphous silicon PIN photodiode. The photoelectric conversion element 102 may be mainly formed of polysilicon or an organic material. The conversion element composed of the photoelectric conversion element 102 and the phosphor layer 315 may be a direct-type conversion element that directly converts radiation such as X-rays to charges and that is made of, for example, amorphous selenium, gallium arsenide, gallium phosphide, lead iodide, mercury iodide, CdTe, or CdZnTe.

The material of the TFT 103 is not limited to an amorphous silicon film formed on an insulating substrate. The TFT (switching element) 103 may be mainly composed of polysilicon or an organic material.

An embodiment will now be described with reference to FIGS. 4A and 4B. As shown in FIG. 4B, the output of the signal line 108 and the amplifier 201 is reset to the voltage Vref by an on-state signal of the switch RC. Subsequently, when the TFT 103 turns to the on state, the following charges Qc are injected by the parasitic capacitance Cgs, and the output voltage Vout of the first-stage amplifier 201 is temporarily represented by the following equation.

$$Qc = Cgs \times (Von - Voff)$$

$$Vout = Vref - (Qc/Cf)$$

That is, $\Delta V = Qc/Cf = Cgs \times (Von - Voff)/Cf$ corresponds to an effect of the parasitic capacitance on the output. Suppose that the dynamic range of the first-stage amplifier 201 connected to the signal line 108 is approximately a voltage V1 (e.g., 5 V here). In this case, in order that the reading-circuit unit 105 accurately reads out charges from the photoelectric conversion element 102, the following relationship is satisfied between the power supply voltage V1 of the first area 106 and the $\Delta V$:

$$V1 > \Delta V = Cgs \times (Von - Voff)/Cf$$

Furthermore, in order to obtain a sufficient dynamic range to produce a satisfactory image, the following relationship is satisfied:

$$V1/2 \geq \Delta V = Cgs \times (Von - Voff)/Cf$$

Second Embodiment

Figure 5:
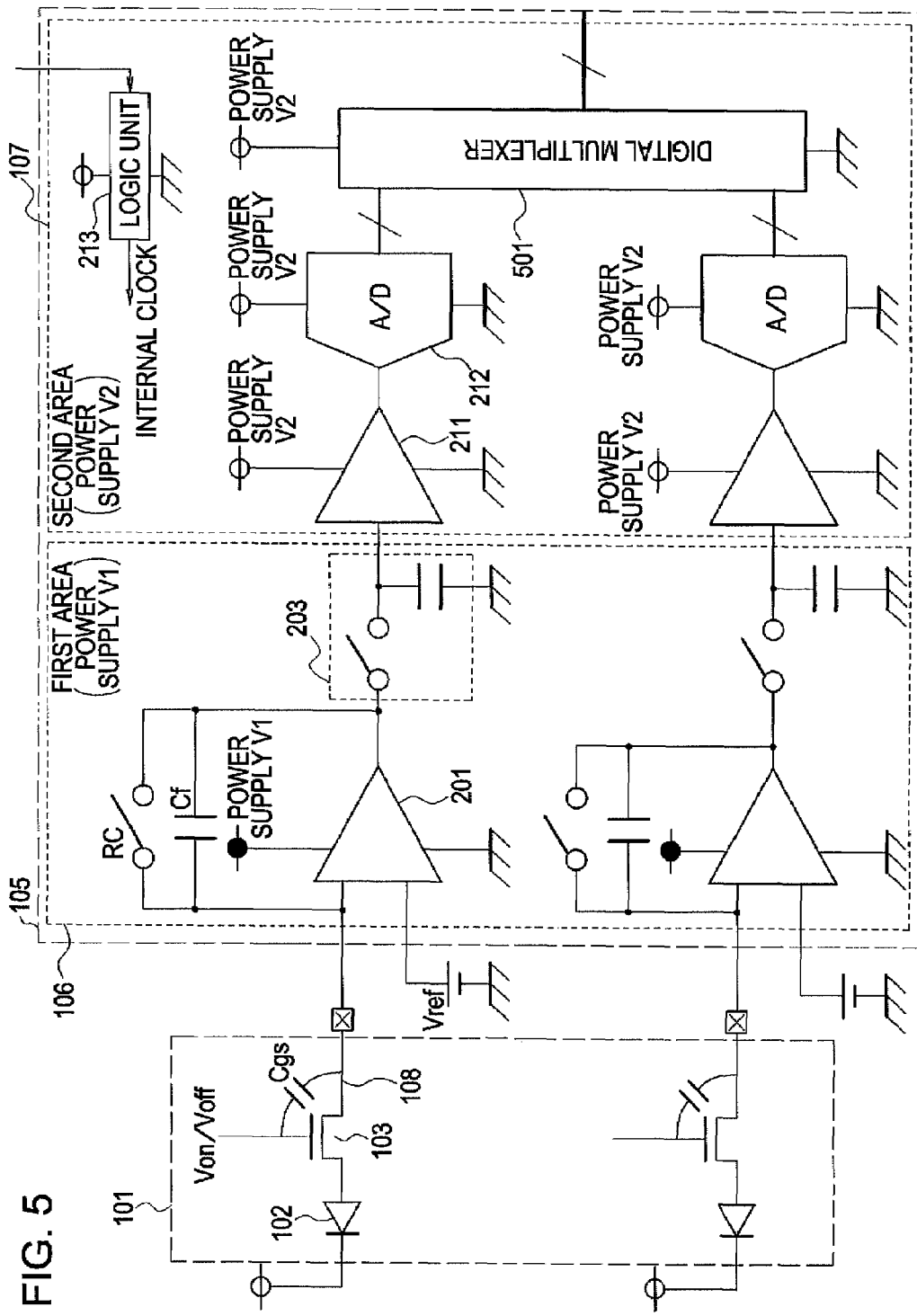
FIG. 5 is a schematic circuit diagram of a reading-circuit unit used in a radiation imaging apparatus according to a second embodiment of the present invention.

FIG. 5 is a schematic circuit diagram of a radiation imaging apparatus according to a second embodiment of the present invention. The basic configuration of this embodiment is the same as that shown in FIG. 1. Only the inside configuration of the reading-circuit unit 105 is different from that of the first embodiment described with reference to FIG. 2.

A noteworthy difference between this embodiment and the first embodiment is that the programmable gain amplifier 211 and the A/D converter 212 are provided in such a number so as to correspond to the number of signal lines 108, and digital data after being subject to A/D conversion is switched with a digital multiplexer 501 to output the data. The digital multiplexer 501 is provided instead of the analog multiplexer 202 shown in FIG. 2. The digital multiplexer 501 converts signals output from the two A/D converters 212 to serial signals and outputs the signals. A power supply voltage V2 is supplied to the digital multiplexer 501 in the second area 107.

In this embodiment, the first area 106 and the second area 107 are monolithically formed. Charge-reading amplifiers composed of the operational amplifiers 201 connected to the signal lines 108 and the sample and hold circuit 203 are provided in the first area 106 driven at the power supply voltage V1 (e.g., 5 V here). The programmable gain amplifiers 211, the A/D converters 212, and the digital multiplexer 501 are provided in the second area 107 driven at the power supply voltage V2 (e.g., 3.3 V here).

The number of A/D converters 212 in this embodiment is larger than that in the first embodiment, and thus the circuit is more complex. However, since the circuit of this embodiment can decrease the speed of the A/D conversion, the configuration of this circuit is more advantageous in terms of noise characteristics.

Third Embodiment

Figure 6:
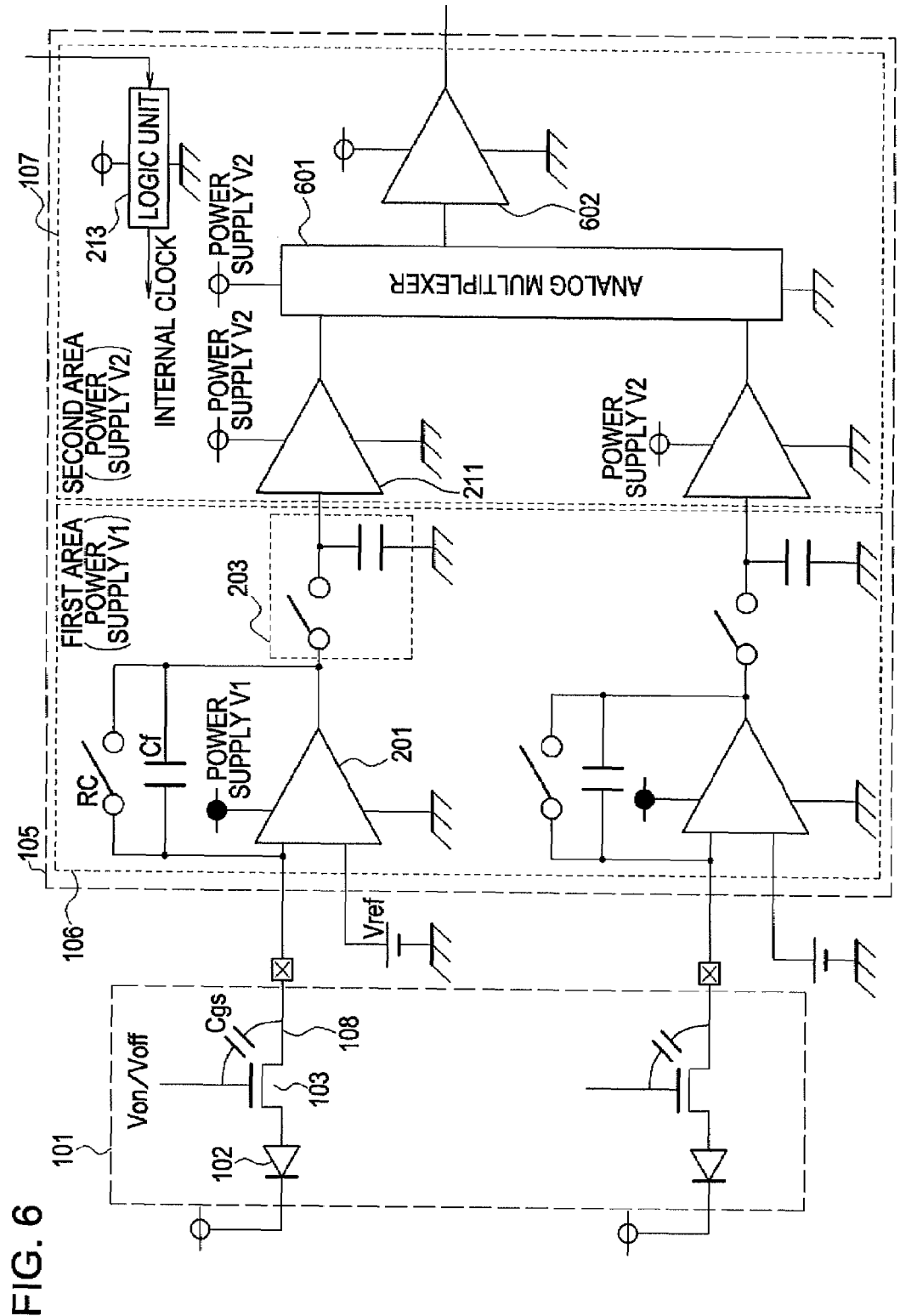
FIG. 6 is a schematic circuit diagram of a reading-circuit unit used in a radiation imaging apparatus according to a third embodiment of the present invention.

FIG. 6 is a schematic circuit diagram of a radiation imaging apparatus according to a third embodiment of the present invention. The basic operation of this embodiment is the same as that shown in FIG. 1. Only the inside configuration of the reading-circuit unit 105 is different from that of the first embodiment described with reference to FIG. 2 and that of the second embodiment described with reference to FIG. 5.

A noteworthy difference between this embodiment and the first and second embodiments is that the reading-circuit unit 105 that is monolithically formed does not include the A/D converter 212 and has a configuration of analog output.

The second area 107 includes programmable gain amplifiers 211, an analog multiplexer 601, and an output amplifier 602 to which the power supply voltage V2 is supplied. The analog multiplexer 601 converts signals output from the two programmable gain amplifiers 211 to serial signals and outputs the signals to the output amplifier 602. The output amplifier 602 amplifies the signals output from the analog multiplexer 601 to output the signals.

Fourth Embodiment

Figure 7:
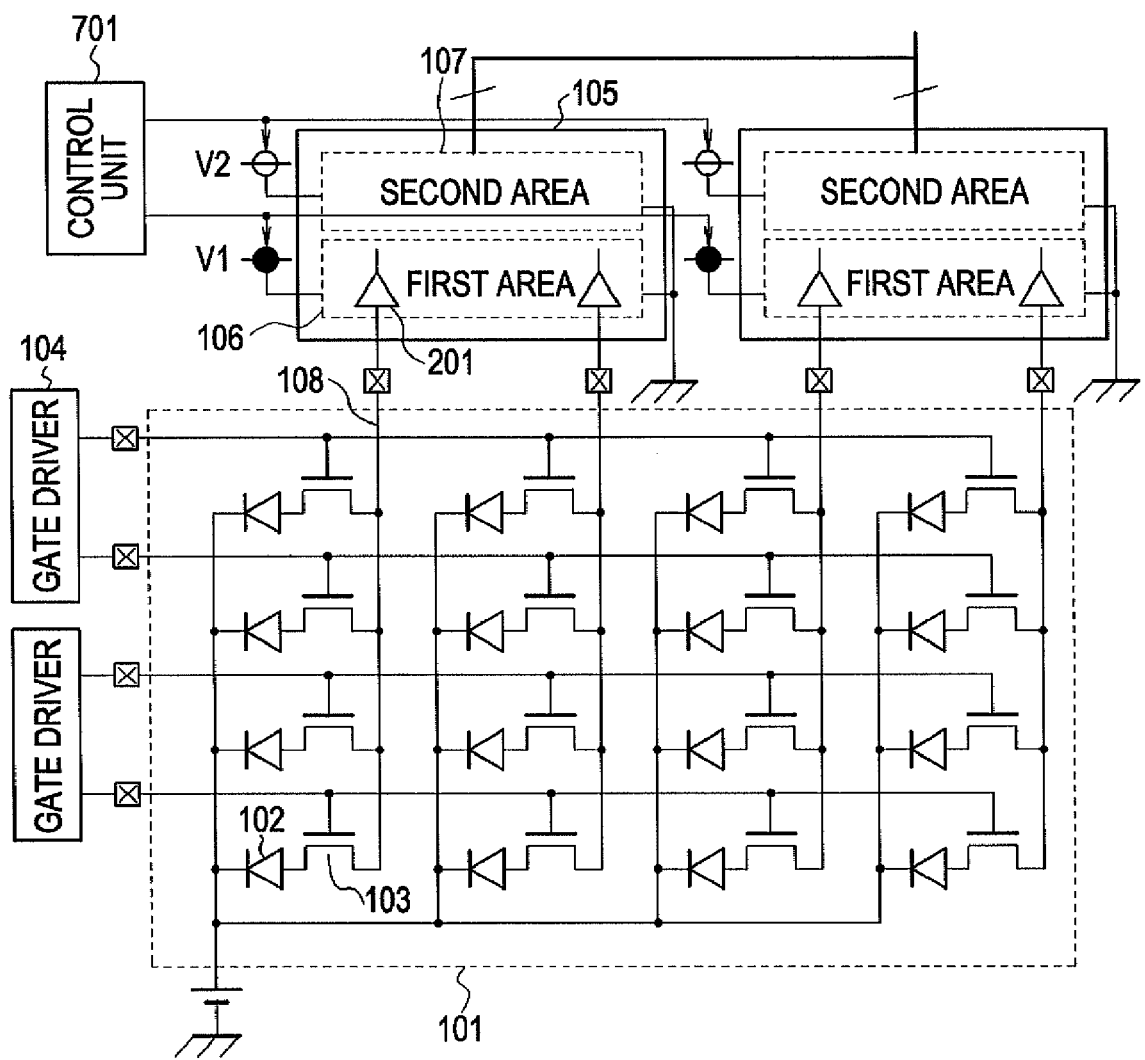
FIG. 7 is a schematic circuit diagram of a radiation imaging apparatus according to a fourth embodiment of the present invention.

FIG. 7 is a schematic circuit diagram of a radiation imaging apparatus according to a fourth embodiment of the present invention. The basic configuration of this embodiment is similar to that of the first embodiment shown in FIG. 1, but differs in the following point.

A noteworthy point in the configuration of this embodiment is that the radiation imaging apparatus further includes a control unit 701 in addition to the configuration of the first embodiment shown in FIG. 1, and the control unit 701 can perform control to change the power supply voltage V1 and/or V2. However, the following relationship is maintained in this embodiment.

The first area 106 driven at the power supply voltage V1 is connected to each signal line 108 of the sensor array 101.

The relationship V1>V2 is satisfied.

The control unit 701 can change at least one of the power supply voltages V1 and V2 on the basis of signals from, for example, a timer, a temperature sensor, an X-ray monitor, or an output monitor of the reading-circuit unit 105 (not shown). For example, when an X-ray dosage is small or when the temperature rise of the radiation imaging apparatus detected by a temperature sensor is large, the control unit 701 controls the power supply voltage V1 to be decreased.

Fifth Embodiment

Figure 8:
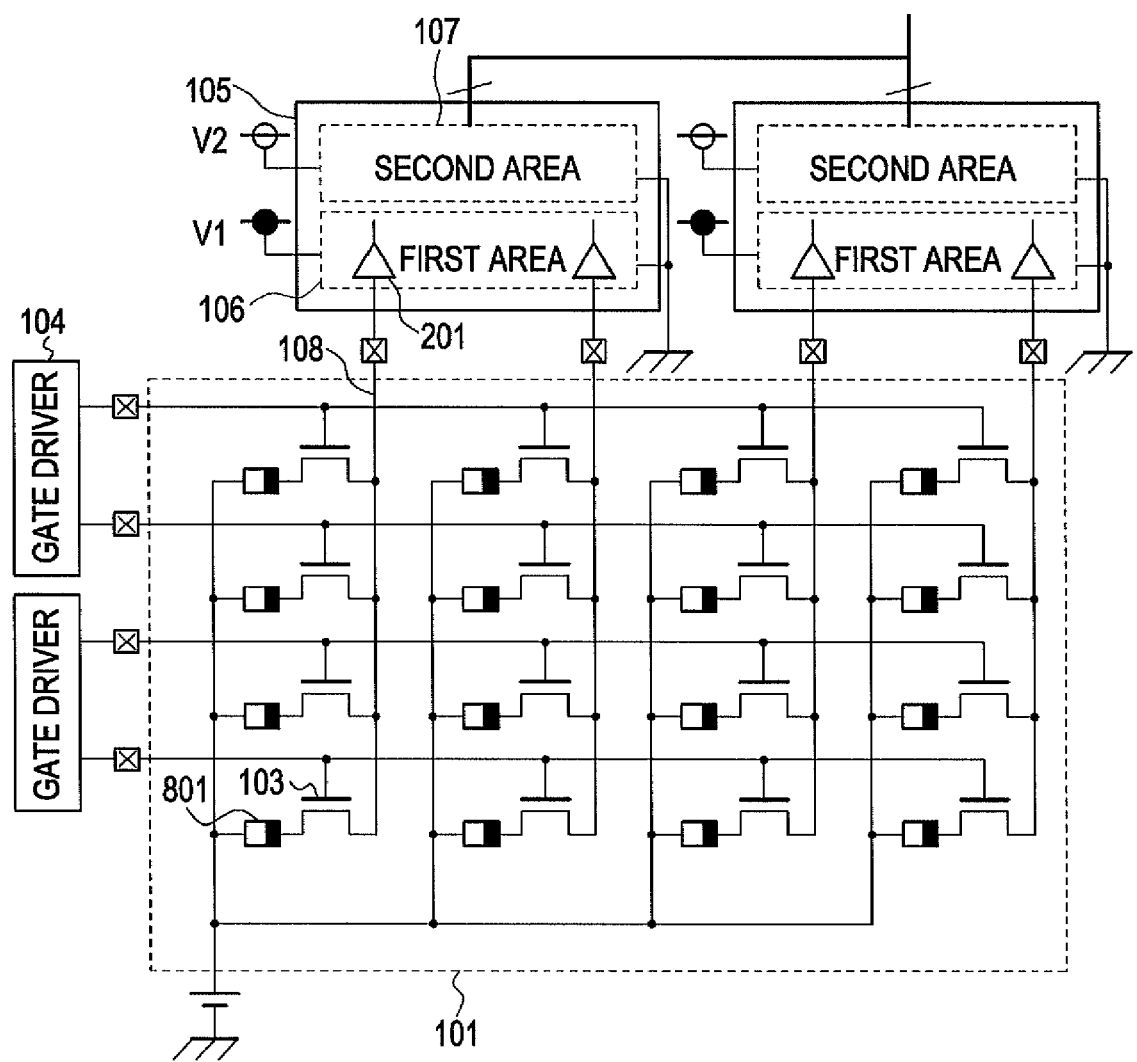
FIG. 8 is a schematic circuit diagram of a radiation imaging apparatus according to a fifth embodiment of the present invention.
Figure 9:
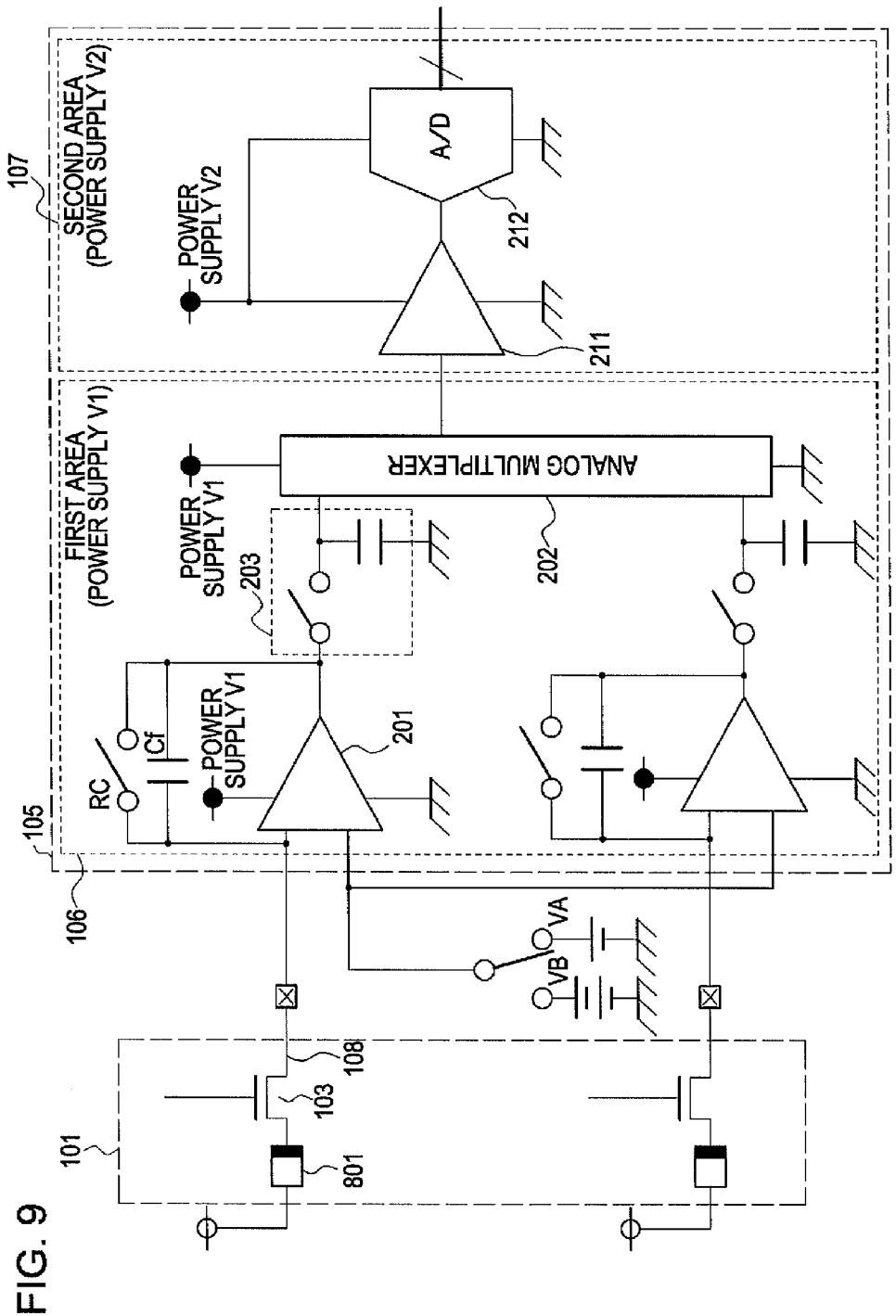
FIG. 9 is a schematic circuit diagram of a reading-circuit unit used in the radiation imaging apparatus according to the fifth embodiment of the present invention.
Figure 10:
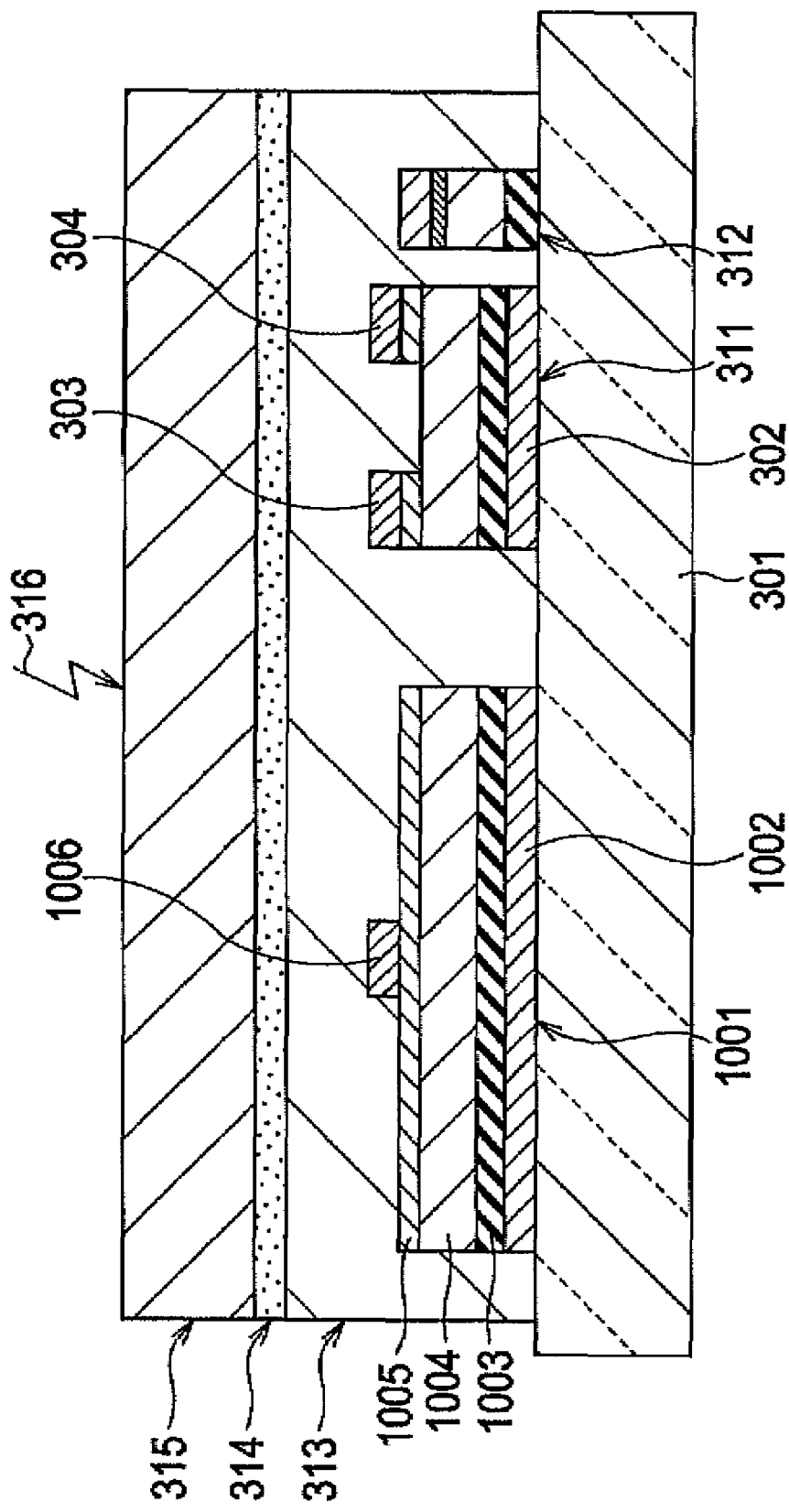
FIG. 10 is a cross-sectional view of a pixel of an area sensor array used in the radiation imaging apparatus according to the fifth embodiment of the present invention.

FIGS. 8, 9, and 10 are diagrams and a view of a radiation imaging apparatus according to a fifth embodiment of the present invention. FIG. 8 is a schematic circuit diagram, FIG. 9 is a schematic circuit diagram illustrating the detail of a reading-circuit unit 105, and FIG. 10 is a cross-sectional view of a pixel of an area sensor array 101 used in the fifth embodiment.

The basic operation of this embodiment is similar to that shown in FIGS. 1, 2, and 3 of the first embodiment, but this embodiment differs from the first embodiment in the following points.

More specifically, it should be noted that, in this embodiment, the photoelectric conversion element of the area sensor array 101 is a metal-insulator-semiconductor (MIS) photoelectric conversion element 801 formed of amorphous silicon. In addition, as shown in FIG. 9, it should be noted that, among input terminals of the operational amplifier 201, the potential of an input terminal that is not connected to the signal line 108 can be changed to a voltage VA or VB.

When the area sensor array 101 including the MIS photoelectric conversion element 801 is driven, refresh driving in which the input potential of the input terminal of the operational amplifier 201, the input terminal not being connected to the signal line 108, is changed to a voltage VA or VB may be performed, as shown in FIG. 9.

In this case, the power supply voltage V1, the voltage VA, and the voltage VB satisfy the relationship V1≧VA>VB and a larger potential difference between the voltage VA and the voltage VB is desired. From this point of view, the power supply voltage V1 supplied to the first area 106 is set to be higher than the power supply voltage V2 supplied to the second area 107.

The area sensor array 101 used in the radiation imaging apparatus of the fifth embodiment will now be described in detail with reference to a cross-sectional view of FIG. 10. An MIS sensor 1001 has a layered structure in which a lower electrode (metal) layer 1002, an insulating layer 1003 such as an amorphous silicon nitride film, an amorphous silicon semiconductor layer 1004, an amorphous silicon $n^+$-layer 1005, an upper electrode (metal) layer 1006, and a protective layer 313 such as an amorphous silicon nitride film are stacked on a glass substrate 301 in that order.

Since this embodiment describes an example of an X-ray imaging apparatus, a phosphor layer 315 is provided on the protective layer 313 with an adhesive layer 314 therebetween. The phosphor layer 315 is made of a gadolinium-based material, cesium iodide, or other material of similar properties as known by one of ordinary skill. The phosphor layer 315 is not necessarily provided on the adhesive layer 314 and may be formed directly on the protective layer 313 by vapor deposition or other processes as known by one of ordinary skill.

Sixth Embodiment

Figure 11:
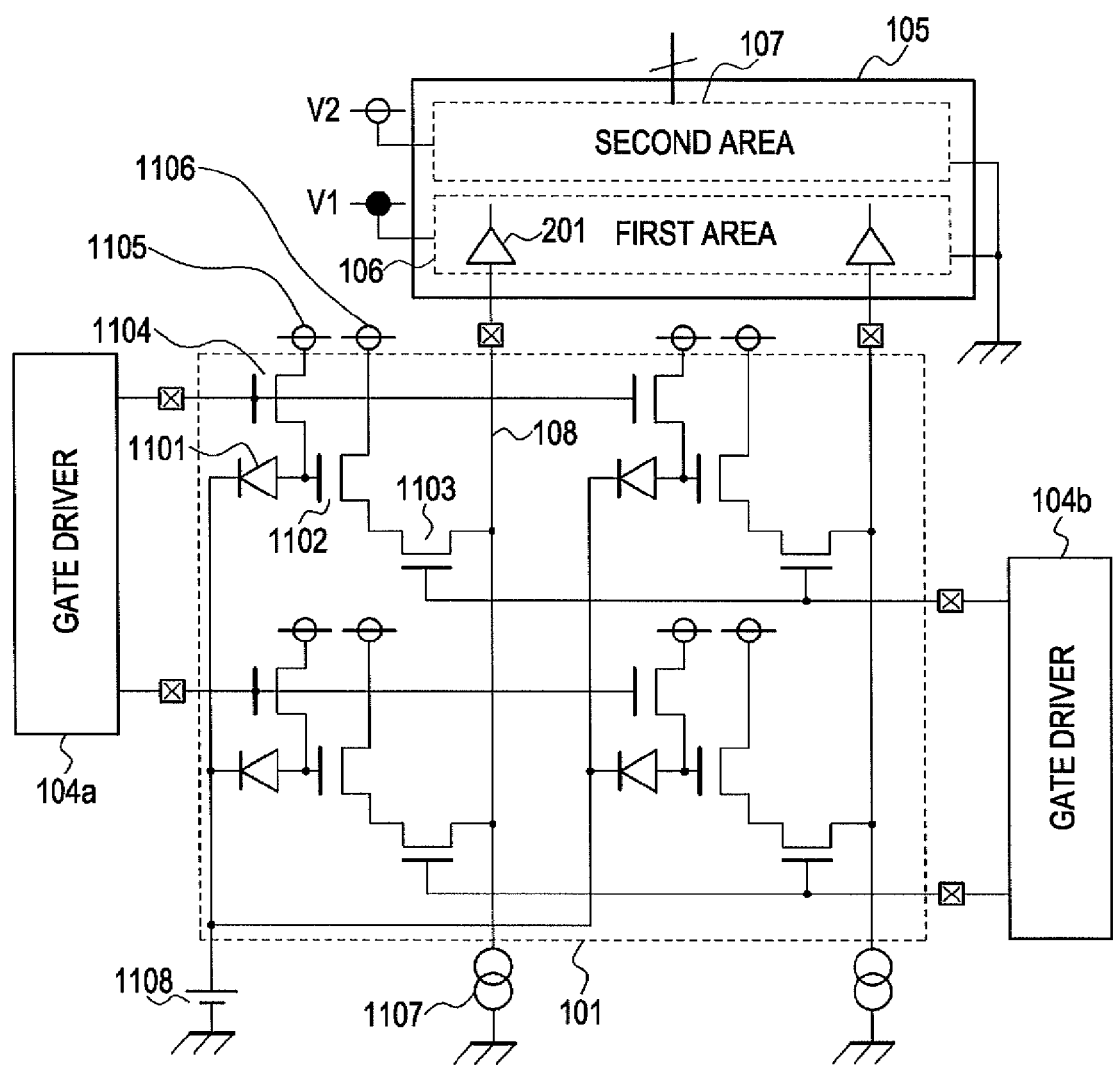
FIG. 11 is a schematic circuit diagram of a radiation imaging apparatus according to a sixth embodiment of the present invention.

FIG. 11 is a schematic circuit diagram of a radiation imaging apparatus according to a sixth embodiment of the present invention. In this embodiment, a pixel of an area sensor array 101 includes a PIN photodiode 1101, a reset TFT 1104, a source follower TFT 1102, and a transfer TFT 1103. The reset TFT 1104 resets the PIN photodiode 1101 and the gate of the source follower TFT 1102 to initialize an image. The signal line 108 connected to the source electrode of the transfer TFT 1103 of each pixel is connected to the first area 106 of the reading-circuit unit 105 that is driven at a power supply voltage V1. As in the other embodiments described above, the reading-circuit unit 105 also includes the second area 107 driven at a power supply voltage V2 and the relationship V1>V2 is satisfied.

A bias voltage source 1108 is connected to the cathode of the photodiode 1101. A gate driver 104a supplies the gate of the reset TFT 1104 with a voltage. The reset TFT 1104 is connected to a reset power supply voltage 1105. The source follower TFT 1102 is connected to a source follower power supply voltage 1106. A gate driver 104b supplies the gate of the transfer TFT 1103 with a voltage. The signal line 108 is connected to a constant current source 1107.

When the reset TFT 1104 turns to the on state by the control of the gate driver 104a, charges of the photodiode 1101 are reset. The photodiode 1101 generates charges by photoelectric conversion and stores the charges. The source follower TFT 1102 outputs a voltage corresponding to the amount of charges stored in the photodiode 1101. In response to the control by the gate driver 104b, the transfer TFT 1103 turns to the on state and transfers the voltage output from the source follower TFT 1102 to the signal line 108.

The configuration of this embodiment is advantageous in that the area sensor array 101 having the source follower TFT 1102 in the pixel has a large amount of output charge.

Seventh Embodiment

Figure 15:
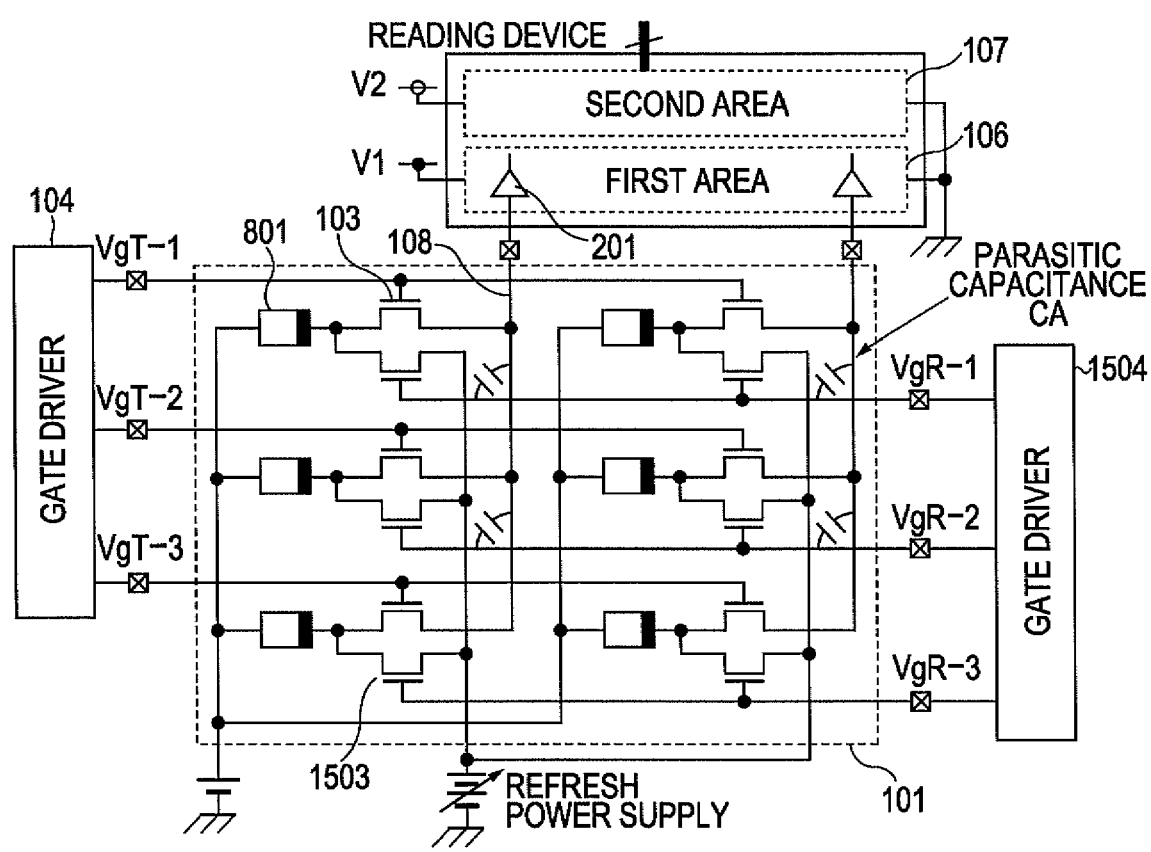
FIG. 15 is a schematic circuit diagram of a radiation imaging apparatus according to a seventh embodiment of the present invention.

FIG. 15 is a schematic circuit diagram of a radiation imaging apparatus according to a seventh embodiment of the present invention. In FIG. 15, components the same as those described in the above embodiments are assigned the same reference numerals, and the detailed description of those components is omitted.

This embodiment is similar to the fifth embodiment shown in FIG. 8 but differs from the fifth embodiment in the following points.

In the fifth embodiment, each pixel includes the MIS photoelectric conversion element 801 and the transfer TFT 103. In this embodiment, each pixel further includes a refresh TFT 1503. The refresh TFT 1503 refreshes the MIS photoelectric conversion element and initializes an image. As in the fifth embodiment, gate lines (first driving wiring) VgT(n) connected to the transfer TFT 103 in common are connected to the gate driver (first driving circuit) 104. In this embodiment, gate lines (second driving wiring) VgR(n) connected to the refresh TFT 1503 in common are further connected to a gate driver (second driving circuit) 1504.

Figure 16:
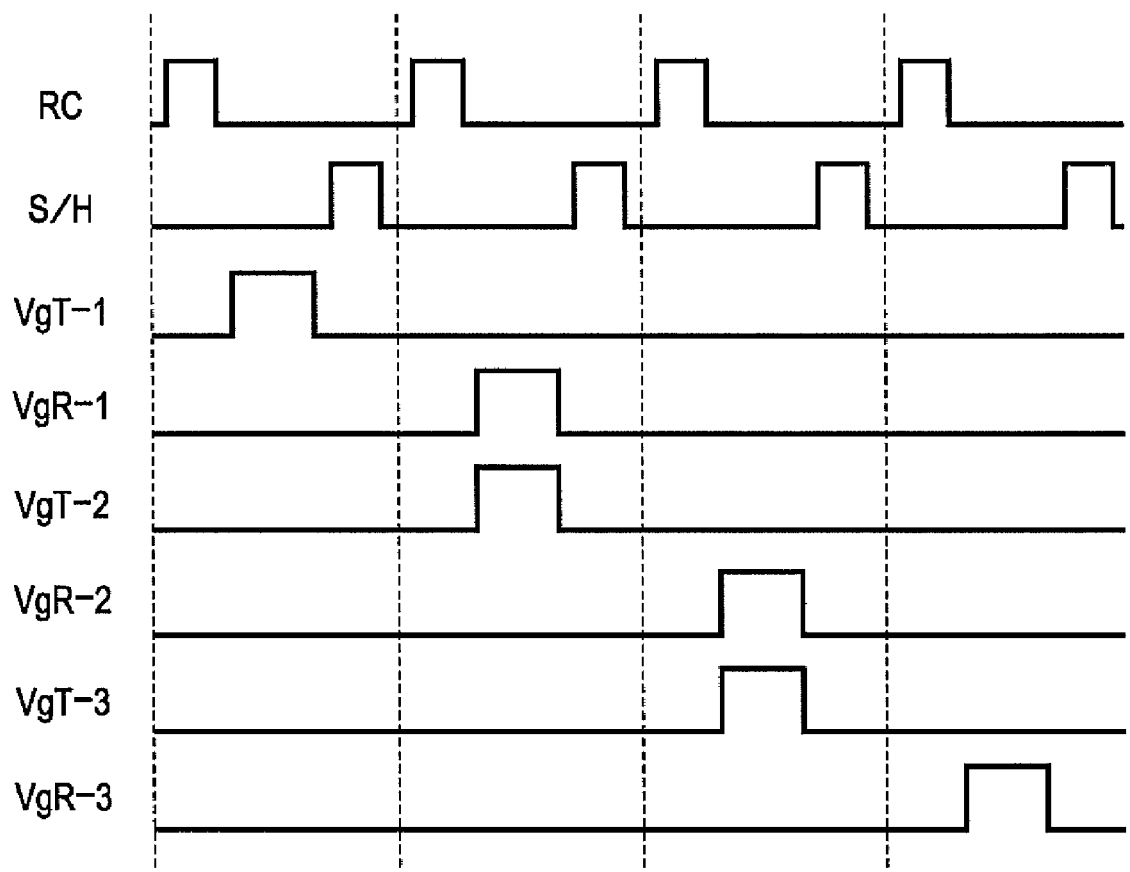
FIG. 16 is a diagram illustrating the operation of the radiation imaging apparatus according to the seventh embodiment of the present invention.

FIG. 16 is a timing diagram illustrating the operation of this embodiment. As shown in FIG. 16, in this embodiment, a driving signal is provided so that an on-state voltage is simultaneously applied to a gate line VgR(n) in a predetermined row and to a gate line VgT(n+1) in the subsequent row. However, the present invention is not limited thereto. The driving signal may be provided so that the on-state voltage is applied to a gate line VgR(n) in a predetermined row and to a gate line VgT(n+1) in the subsequent row at a different timing.

In this embodiment, it is necessary to note the following. As compared with the fifth embodiment, a parasitic capacitance CA is present at the intersection of the gate line VgR for refresh and the signal line 108, and charges are further injected by the parasitic capacitance CA when the refresh TFT 1503 turns to the on state. Therefore, satisfying the relationship V1>V2 in this embodiment provides a more significant effect.

Here, the on-state voltage and the off-state voltage of the transfer TFT 103 are represented by Von1 and Voff1, respectively. The on-state voltage and the off-state voltage of the refresh TFT 1503 are represented by Von2 and Voff2, respectively. When the on-state voltage is applied to a gate line VgR(n) in a predetermined row and to a gate line VgT(n+1) in the subsequent row at a different timing, V1 is set so as to satisfy the following relationship:

$$V1 > \Delta V1 = Cgs \times (Von1 - Voff1)/Cf \text{ and}$$

$$V1 > \Delta V2 = CA \times (Von2 - Voff2)/Cf$$

Furthermore, in order to obtain a sufficient dynamic range to produce a satisfactory image, the following relationships are satisfied.

$$V1/2 \geq \Delta V1 = Cgs \times (Von1 - Voff1)/Cf \text{ and}$$

$$V1/2 \geq \Delta V2 = CA \times (Von2 - Voff2)/Cf$$

When the on-state voltage is simultaneously applied to a gate line VgR(n) in a predetermined row and to a gate line VgT(n+1) in the subsequent row, V1 is set so as to satisfy the following relationship:

$$V1>\Delta V1+\Delta V2=(Cgs\times(Von1-Voff1)/Cf)+(CA\times(Von2-Voff2)/Cf)$$

Furthermore, in order to obtain a sufficient dynamic range to produce a satisfactory image, the following relationships are satisfied.

$$V1/2 \geq \Delta V=(Cgs\times(Von1-Voff1)/Cf)+(CA\times(Von2-Voff2)/Cf)$$

This embodiment describes an example in which an MIS photoelectric conversion element is used, but the present invention in not limited thereto. Alternatively, a PIN photodiode may be used. In such a case, the TFT 1503 operates so as to reset the PIN photodiode to initialize an image.

Eighth Embodiment

Figure 12:
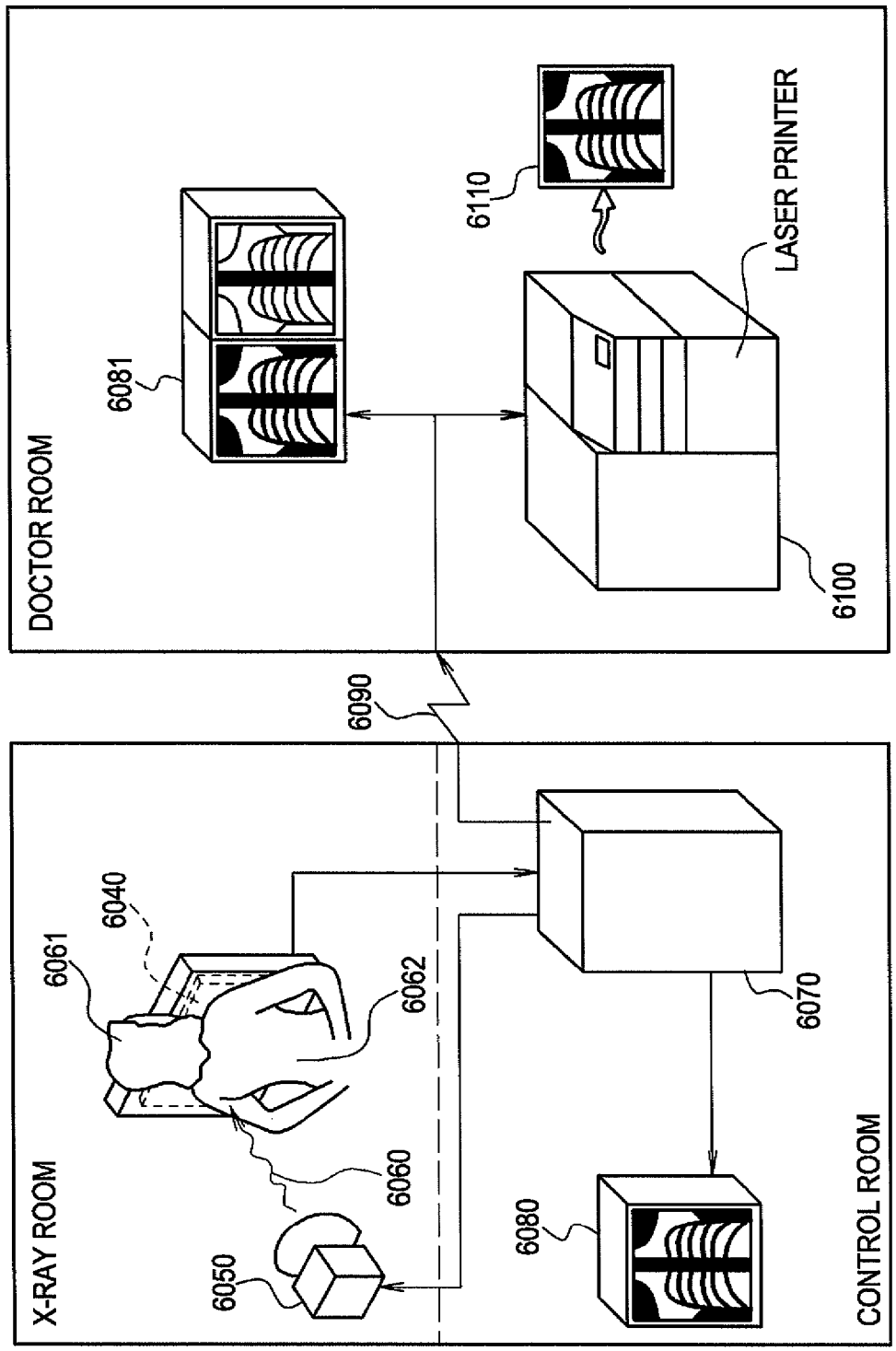
FIG. 12 is a view of an X-ray imaging system according to an eighth embodiment of the present invention.

FIG. 12 is a system diagram of an X-ray imaging system according to an eighth embodiment of the present invention. In this embodiment, the radiation imaging apparatus of any of the first to seventh embodiments is applied to an X-ray imaging system. Features of this X-ray imaging system lie in the following: A flat-panel radiation imaging apparatus composed of the area sensor array 101, the gate drivers 104 or the gate drivers 104a and 104b, and the reading-circuit unit 105 is provided inside an image sensor 6040. An image processor 6070 controls an X-ray tube (radiation source) 6050, the image sensor 6040, a display apparatus 6080, and a communication device 6090.

In an X-ray room, the X-ray tube (radiation source) 6050 generates X-rays (radiation) 6060, and the image sensor 6040 is irradiated with the X-rays (radiation) 6060 through a subject 6062. The image sensor 6040 generates image information of the subject 6062.

In a control room, the image processor 6070 can display the image information on the display apparatus 6080 or transmit the image information to a film processor 6100 via the communication device 6090.

In a doctor room, the film processor 6100 can display the image information on a display 6081 or print the image information on a film 6110 with a laser printer.

The application of the radiation imaging apparatus of any of the first to seventh embodiments can realize a medical X-ray imaging system that has a low power consumption and excellent noise characteristics and dynamic range characteristics.

Furthermore, because of a low power consumption and a low heat generation, an X-ray imaging system can be realized in which the degradation of image quality due to heat is suppressed, which does not require a large-scale heat dissipation mechanism, which has a high reliability, and which is inexpensive and has excellent image quality. The power consumption can be reduced. Furthermore, a radiation imaging apparatus suitable for use in, for example, a medical radiographic X-ray imaging system which has a sufficient dynamic range with a low noise level and which suppresses heat generation due to power consumption can be realized.

While the present invention has been described with reference to exemplary embodiments, it is to be understood that the invention is not limited to the disclosed exemplary embodiments. The scope of the following claims is to be accorded the broadest interpretation so as to encompass all modifications, equivalent structures and functions.

This application claims the benefit of Japanese Application No. 2006-118325 filed Apr. 21, 2006 and No. 2007-092029 filed Mar. 30, 2007, which are hereby incorporated by reference herein in their entirety.

What is claimed is:

1. An imaging apparatus comprising:

a sensor array in which a plurality of pixels each including a photoelectric conversion element and a switching element are arrayed in a row direction and a column direction;

signal wiring connected to a plurality of the switching elements provided in the column direction; and a reading-circuit unit connected to the signal wiring, wherein the reading-circuit unit includes a first operational area including a first amplifying circuit and a second operational area including a second amplifying circuit connected to the first operational area, and the first and second amplifying circuits are each arranged to be supplied with power within a range, the maximum of the power-supply voltage range of the first amplifying circuit being larger than the maximum of a power-supply voltage range of the second amplifying circuit.

2. An imaging apparatus according to claim 1, wherein the first amplifying circuit is connected to the signal wiring and has a charge storage capacitance Cf; the switching element includes a gate electrode, a source electrode, and a drain electrode; the signal wiring is connected to either the source electrode or the drain electrode of a plurality of the switching elements disposed in the column direction; and when a parasitic capacitance between the gate and the source of the switching element is represented by Cgs, the on-state voltage of the switching element is represented by Von, and the off-state voltage of the switching element is represented by Voff, the power supply voltage V1 of the first operational area satisfies the following relationship:

$$V1>Cgs\times(Von-Voff)/Cf.$$

3. An imaging apparatus according to claim 1, wherein the first operational area and the second operational area are integrated circuits provided on a single silicon substrate.

4. An imaging apparatus according to claim 1, wherein the first operational area and the second operational area are integrated circuits provided on separate silicon substrates.

5. An imaging apparatus according to claim 1, wherein the first operational area comprises, as the first amplifying circuit, an operational amplifier an input terminal of which is connected to the signal wiring.

6. An imaging apparatus according to claim 5, wherein the operational amplifier constitutes a charge-reading amplifier to which an integral capacitor is connected.

7. An imaging apparatus according to claim 5, wherein the second operational area comprises at least an amplifier serving as the second amplifying circuit that is different from the operational amplifier in the first operational area.

8. An imaging apparatus according to claim 1, wherein the second operational area comprises at least one A/D converter.

9. An imaging apparatus according to claim 8, wherein the A/D converters are provided in such a number so as to correspond to the number of signal wirings.

10. An imaging apparatus according to claim 1, further comprising a control unit that can change at least one of the power supply voltage of the first operational area and the power supply voltage of the second operational area.

11. An imaging apparatus according to claim 2, wherein the power supply voltage V1 of the first operational area satisfies the following relationship:

$$V1/2 \geq Cgs \times (Von-Voff)/Cf.$$

12. A radiation imaging apparatus comprising:
a sensor array in which a plurality of pixels each including a conversion element that converts radiation to electric signals and a switching element are arrayed in a row direction and a column direction;
signal wiring connected to a plurality of the switching elements provided in the column direction; and
a reading-circuit unit connected to the signal wiring,
wherein the reading-circuit unit includes a first operational area including a first amplifying circuit and a second operational area including a second amplifying circuit connected to the first operational area, and
the first and second amplifying circuits are each arranged to be supplied with power within a range, the maximum of the power-supply voltage range of the first amplifying circuit being larger than the maximum of a power-supply voltage range of the second amplifying circuit.

13. A radiation imaging system comprising:
the radiation imaging apparatus according to claim 12; and
a radiation source that generates radiation.

* * * * *